United States Patent [19]
Corzine et al.

[11] Patent Number: 5,867,516
[45] Date of Patent: Feb. 2, 1999

[54] VERTICAL CAVITY SURFACE EMITTING LASER WITH REDUCED TURN-ON JITTER AND INCREASED SINGLE-MODE OUTPUT

[75] Inventors: Scott W. Corzine, Sunnyvale; Michael R.T. Tan, Menlo Park, both of Calif.

[73] Assignee: Hewlett-Packard Company, Palo Alto, Calif.

[21] Appl. No.: 614,988

[22] Filed: Mar. 12, 1996

[51] Int. Cl.$^6$ ........................................................ H01S 3/19
[52] U.S. Cl. .................................. 372/45; 372/46; 372/96
[58] Field of Search ................................ 372/44, 45, 46, 372/96

[56] References Cited

U.S. PATENT DOCUMENTS

| | | | |
|---|---|---|---|
| 5,659,568 | 8/1997 | Wang et al. | 372/46 |
| 5,661,742 | 8/1997 | Huang et al. | 372/46 |
| 5,670,789 | 9/1997 | Iwata | 372/45 |

OTHER PUBLICATIONS

Nichols, D. T. et al., "Optical Transmission Systems Employing Vertical Cavity Surface Emitting Lasers and Monolithically Integrated Photoreceivers", Applied Physics Letters, vol. 65, No. 24, Dec. 12, 1994, pp. 3054–3056.

Valle, A. et al., "Spatial Hole Burning Effects on the Dynamics of Vertical Cavity Surface Emitting Laser Diodes", IEEE Journal of Quantum Electronics, vol. 31, No. 8 Aug. 1995, New York, pp. 1423–1431.

Adalberto Sapia et al., "Pattern Effects in Time Jitter of Semiconductor Lasers", Applied Physics Letters, vol. 61, No. 15, Oct. 12, 1992, pp. 1748–1750.

*Primary Examiner*—James W. Davie
*Attorney, Agent, or Firm*—Ian Hardcastle

[57] ABSTRACT

A VCSEL that laser comprises a first mirror layer, an active layer including a quantum well region and a diffusion enhancing region, and a second mirror layer. The first and second mirror layers are layers of doped semiconductor material having a first and a second conductivity mode, respectively. The active layer is a layer of semiconductor material adjacent the first mirror layer. The second mirror layer is adjacent the active layer, remote from the first mirror layer. The diffusion enhancing region is a region of the active layer in which the semiconductor material of the active layer is doped with an acceptor impurity to such a high concentration that holes induced in the quantum well region by the diffusion enhancing region predominate over electrons in the quantum well region by about one order of magnitude.

7 Claims, 6 Drawing Sheets

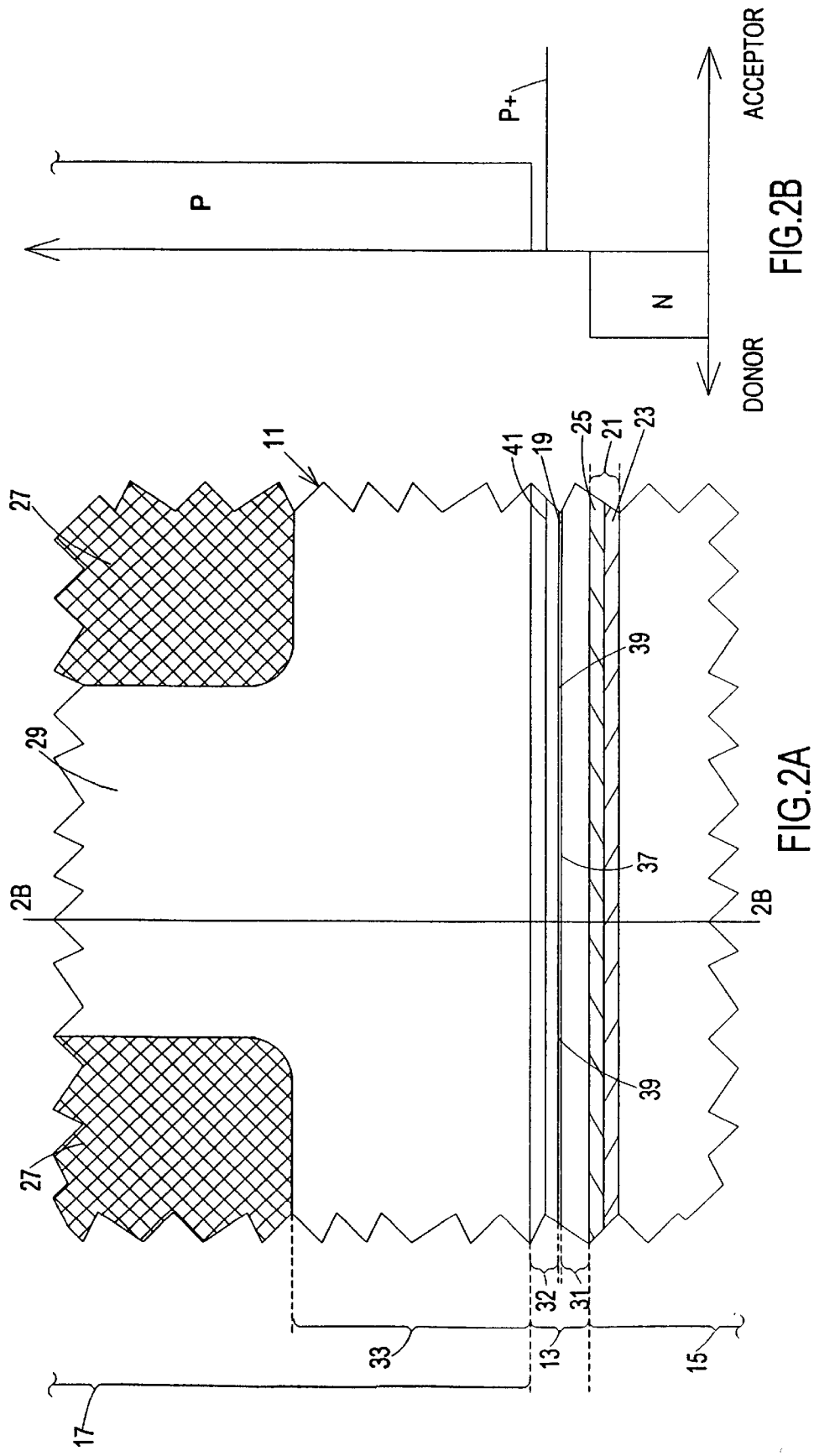

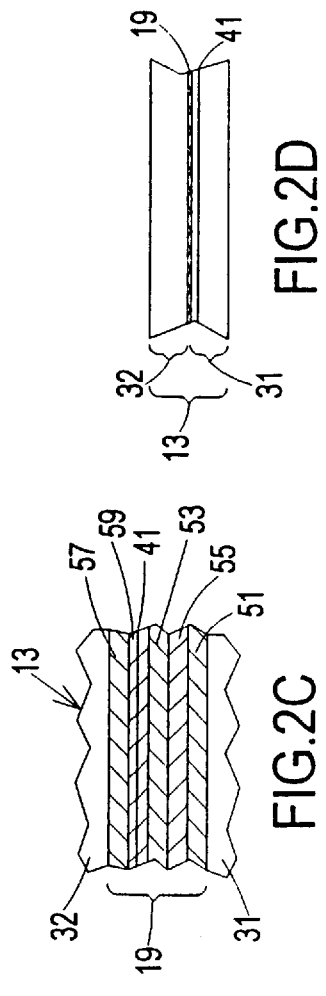

5,867,516

VERTICAL CAVITY SURFACE EMITTING LASER WITH REDUCED TURN-ON JITTER AND INCREASED SINGLE-MODE OUTPUT

FIELD OF THE INVENTION

The invention relates to semiconductor lasers and, in particular, to vertical-cavity surface-emitting semiconductor lasers.

BACKGROUND OF THE INVENTION

Vertical-cavity surface-emitting lasers (VCSELs) have many advantages over traditional edge-emitting lasers, such as low cost manufacturing, high yield, good beam quality, and scalable geometries. These properties make VCSELs desirable for many applications. For example, K. H. Hahn, M. R. T. Tan, and S. Y. Wang describe using VCSELs in multimode fiber data links in *Modal and Intensity Noise of Large-Area Multiple-Transverse-Mode VCSELs in Multimode-Optical-Fiber Links*, 1994 CONFERENCE ON OPTICAL FIBER COMMUNICATION—paper ThB3, OFC '94. However, the turn-on jitter (variation in turn-on delay time) of VCSELs can limit the maximum bit rate that can be achieved in such data links. This problem is described by C. R. Mirasso, P. Colet, and M. San Miguel in *Dependence of Timing Jitter on Bias Level for Single-mode Semiconductor Lasers under High Speed Operation*, QE-29 IEEE J. QUANTUM ELECTRON., pp. 23–32, (1993), by A. Sapia, P. Spano, C. R. Mirasso, P. Colet, and M. San Miguel in *Pattern Effects in Timing Jitter of Semiconductor Lasers*, 61 APPL. PHYS. LETT., pp. 1748–1750 (1992), and by T. M. Shen in *Timing Jitter in Semiconductor Lasers under Pseudorandom Word Modulation*, 7 J. LIGHTWAVE TECHNOLOGY, pp. 1394–1399, (1989).

It is known that the turn-on delay of a VCSEL varies depending on the off time of the VCSEL, i.e., the time that the laser current was switched off before it switched on again. Since the off time of the VCSEL varies according to length of the run of 0s in the data modulating the laser current, the turn-on delay of the VCSEL is subject to a data-dependent jitter. FIGS. 1A and 1B illustrate the bit pattern-dependence of the turn-on delay time of a single-mode VCSEL. FIG. 1A shows the time dependence of the photon density during the turn-on process with two extreme bit patterns. FIG. 1B shows the time dependence of the photon density during the turn-on process with the two extreme bit patterns and with some intermediate bit patterns. In FIGS. 1A and 1B, the bit duration is 1 ns, and the laser current is switched between an OFF state of about one-half of the threshold current of the VCSEL and an ON state of about five times the threshold current. In FIG. 1A, the turn-on delay time illustrated by curve A, in which a long string of 0s precedes switching to 1 is considerably longer than the turn-on delay time illustrated by curve B, in which a long string of 1s is followed by a single 0 bit before switching back to 1. Comparing curve A with curve B shows that the turn-on delay time varies depending on the bit pattern of the laser current.

FIG. 1B shows the variation of the photon density in response to several different pseudo-random word patterns that include the extreme bit patterns shown in FIG. 1A with some intermediate bit patterns. Each trace represents a run of a different number of 0s between consecutive 1s. The difference between the maximum and minimum turn-on delay is called the jitter spread. The jitter spread imposes a limitation on the maximum rate at which the VCSEL can be modulated.

In addition to being subject to jitter spread, VCSELs are also subject to spatial hole burning. In VCSELs, light is generated by the laser current flowing through a large cross-sectional area of semiconductor material in the quantum well region. In some applications, a VCSEL is required to emit a light beam having a single Gaussian intensity distribution. This is known as single mode operation, and the light beam generated by the laser in single mode operation will be called a single light beam. VCSELs emit a single light beam when the laser current is just above the threshold level. However, when the laser current is increased beyond a second, higher, threshold level, the laser begins to emit a light beam with a double, or higher, Gaussian intensity distribution.

The VCSEL generates the single light beam in a central stimulated emission zone of the quantum well region. Since light generation depletes the density of carriers depending on the intensity of the light generated, generation of the single light beam results in a depletion zone forming in the center of the stimulated emission zone, and a corresponding increase in the carrier density in a zone surrounding the depletion zone. Spatial hole burning occurs when the carrier density in the depletion zone falls below the threshold, so that light is no longer generated in the depletion zone. The light beam generated by the VCSEL then assumes a double Gaussian intensity profile. At higher laser currents, additional depletion zones may form in the stimulated emission zone, resulting in the light beam generated by the VCSEL having a multiple Gaussian intensity profile. Such an intensity profile makes the VCSEL unsuitable for use in applications in which a light beam having a single Gaussian intensity distribution is required.

The limiting effect of spatial hole burning on the maximum intensity at which VCSELs can generate a single light beam makes VCSELs unsuitable for certain applications. For example, a laser suitable for writing on a magneto-optical disc is required to generate a single light beam with a power of about 30 mW, whereas the highest single light beam power that can be generated by known VCSELs is in the range of 1–2 mW.

Accordingly, to increase the bit transmission rate of VCSEL-based optical communication systems, and to increase the speed at which the light output of the VCSEL of a laser printer can be modulated, and for other applications in which the light output of the VCSEL must be modulated at high speed, a VCSEL having reduced jitter spread is required. Also, to enable VCSELs to be used in applications in which a single light beam having a high intensity is required, a VCSEL is needed in which the onset of spatial hole burning occurs, if at all, at a substantially-increased light intensity compared with known VCSELs.

SUMMARY OF THE INVENTION

The invention provides a vertical cavity surface-emitting laser (VCSEL) having a reduced turn-on jitter and reduced spatial hole burning. The laser comprises a first mirror layer, an active layer including a quantum well region and a diffusion enhancing region, and a second mirror layer. The first mirror layer is a layer of doped semiconductor material having a first conductivity mode. The active layer is a layer of semiconductor material adjacent the first mirror layer. The second mirror layer is adjacent the active layer and remote from the first mirror layer, and is a layer of doped semiconductor material having a second conductivity mode. The diffusion enhancing region is a region of the active layer in which the semiconductor material of the active layer is doped with an acceptor impurity to such a high concentration that holes induced in the quantum well region by the diffusion enhancing region predominate over electrons in the quantum well region by about one order of magnitude.

The diffusion enhancing region increases the diffusion rate of carriers in the quantum well region by a factor of between five and 25. This enables carriers to diffuse rapidly within the quantum well region. The diffusion enhancing region enables carriers that would otherwise accumulate in an annular region surrounding the stimulated emission zone of the quantum well region to diffuse rapidly into the stimulated emission zone when the laser current is switched off. This reduces dependence of the turn on time of the laser on the off time of the laser, and hence reduces jitter spread. The diffusion enhancing region also enables carriers to diffuse from zones of higher carrier density in the quantum well region into the depletion zones caused by the generation of light by stimulated emission, which reduces the likelihood of spatial hole burning occurring.

The diffusion enhancing region may be located outside the quantum well region in the active layer. Alternatively, the diffusion enhancing region may encompass the quantum well region in the active layer. However, the diffusion enhancing region is preferably a delta-doped region in the active layer.

The semiconductor material in the diffusion enhancing region may be doped with the acceptor impurity at a sheet density $P_{dope,sheet}$ such that the density of holes P' induced by the diffusion enhancing region in the quantum well region exceeds $10^{19} cm^{-3}$. The sheet density $P_{dope,sheet}$ of the acceptor impurity is approximately $P' \times t_{QW}$, where $t_{QW}$ is the total thickness of the quantum wells in the quantum well region.

Alternatively, the semiconductor material in the diffusion enhancing region may be doped with the acceptor impurity at a concentration $P_{dope}$ such that the density of holes P' induced by the diffusion enhancing region in the quantum well region exceeds $10^{19} cm^{-3}$. The concentration of the acceptor impurity $P_{dope}$ depends on the density of holes P' in the quantum well region, the thickness $t_{QW}$ of the quantum well region and the thickness $t_{DER}$ of the diffusion enhancing region according to the expression $P_{dope}=P' \times t_{QW}/t_{DER}$.

BRIEF DESCRIPTION OF THE DRAWINGS

FIG. 2A is a cross sectional view of part of the preferred embodiment of a VCSEL according to the invention.

FIG. 2B shows the doping profile of the preferred embodiment of a VCSEL according to the invention.

FIG. 2C is a cross-sectional view of part of the quantum well region of a VCSEL according to the invention showing a first alternative location of the diffusion enhancing region.

FIG. 2D is a cross-sectional view of part of a VCSEL according to the invention showing a second alternative location of the diffusion enhancing region.

FIG. 2E is a cross-sectional view of part of a VCSEL according to the invention showing a first alternative configuration and location of the diffusion enhancing region.

FIG. 2F is a cross-sectional view of part of a VCSEL according to the invention showing a second alternative configuration and location of the diffusion enhancing region.

DETAILED DESCRIPTION OF THE INVENTION

Figure 1A:
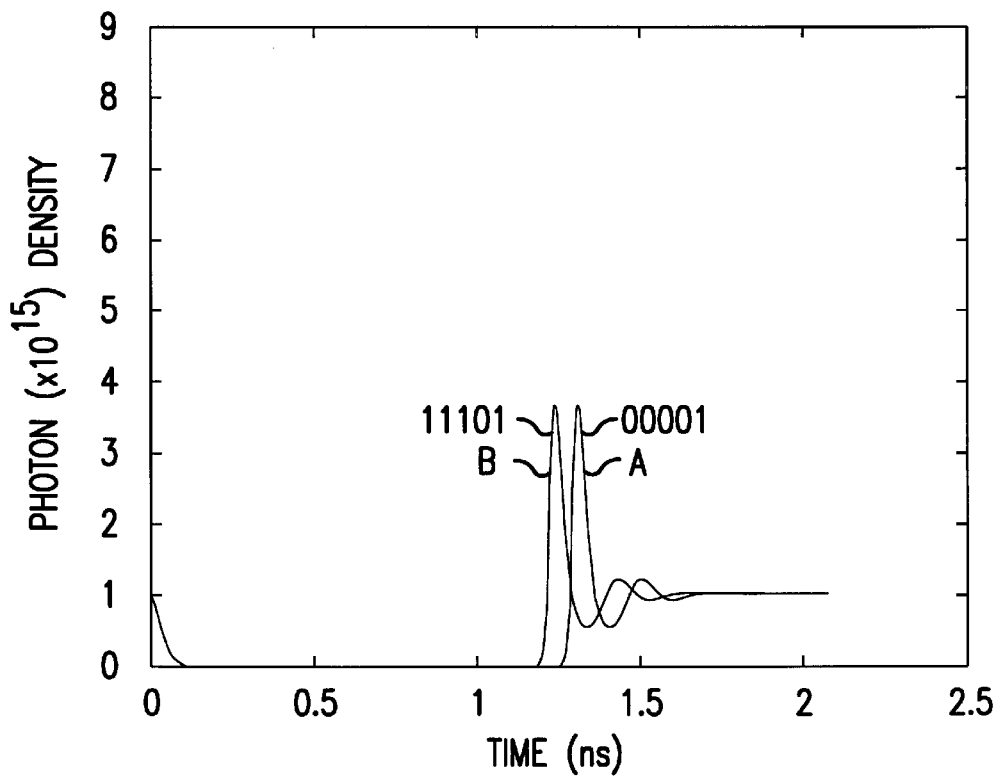
FIG. 1A is a graph showing the variation of the photon density in a known VCSEL in response to the laser current modulated by two extreme bit patterns.
Figure 1B:
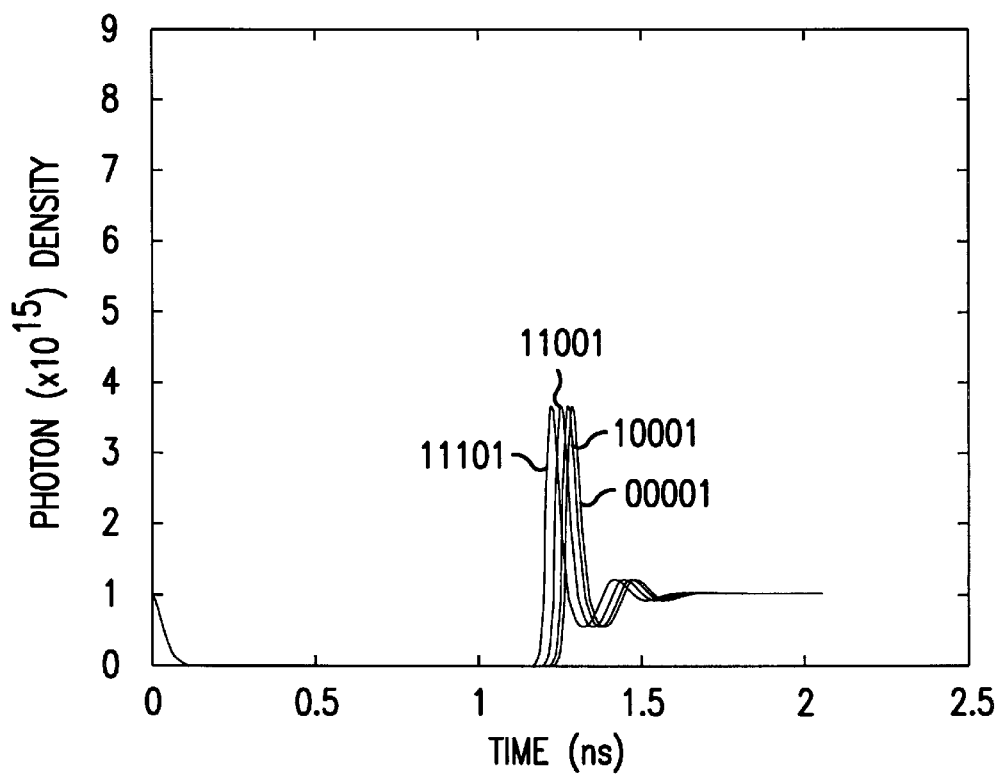
FIG. 1B is a graph showing the variation of the photon density in a known VCSEL in response to the laser current modulated by several different pseudo-random word patterns that include the extreme bit patterns shown in FIG. 1A and some intermediate bit patterns.

The invention provides a VCSEL having a reduced jitter spread and in which the onset of spatial hole burning occurs at an increased light intensity compared with known VCSELs. In the VCSEL according to the invention, the active layer is formed to include a diffusion enhancing region. The diffusion enhancing region is a layer of semiconductor material that is heavily doped with an acceptor impurity. The diffusion enhancing region is located in the active layer adjacent the quantum well region, or inside the quantum well region, or encompassing the quantum well region. The diffusion enhancing region induces a very high density of holes in the quantum well region. The high density of holes in the quantum well region significantly increases the ambipolar diffusion rate of carriers in the quantum well region. Increasing the ambipolar diffusion rate of the carriers in the quantum well region enables carriers to diffuse rapidly in the quantum well region, which significantly reduces the jitter spread of the VCSEL, and increases the maximum light intensity that can be generated before the onset of spatial hole burning.

The preferred embodiment 11 of a VCSEL according to the invention is shown in FIG. 2A. FIG. 2A is a cross sectional view of the part of the VCSEL that includes the stimulated emission zone 37 of the active layer 13, and part of the core zone 29. The active layer is epitaxially grown on the lower mirror layer 15. The upper mirror layer 17 is epitaxially grown on the active layer. Only the upper part of the lower mirror layer adjacent the active layer and the lower part of the upper mirror layer adjacent the active layer are shown to simplify the drawing. The lower mirror layer and the upper mirror layer are doped to have opposite conductivity modes. For example, the lower mirror layer is preferably doped with a donor impurity (n-type), and the upper mirror layer is preferably doped with an acceptor impurity (p-type).

The upper mirror layer 17 includes the proton implanted zone 27, which defines and surrounds the core zone 29. The proton implanted zone confines the laser current flowing through the upper mirror layer to the core zone. The laser current flows from an electrode formed on the upper surface of the upper mirror layer to an electrode formed on the bottom surface of the substrate on which the lower mirror layer 15 is deposited. The electrodes, the substrate, and the upper surface of the upper mirror layer are not shown in FIG. 2A so that the structure of the VCSEL 11 near the active layer can be shown with greater clarity.

The active layer 13 has a thickness of a multiple of $\lambda_n$, where $\lambda_n$ is the wavelength in the material of the active layer of the light generated in the quantum well region 19. The preferred thickness of the active layer is $\lambda$. The active layer is sandwiched between the lower mirror layer 15 and the upper mirror layer 17. The active layer includes the lower cladding region 31, the upper cladding region 32 and the quantum well region 19. The thickness of the cladding regions is such that the quantum well region is located half way between the lower mirror layer and the upper mirror layer. Structural details of the quantum well region are omitted from FIG. 2A to simplify the drawing, but are shown in FIG. 2C and will be described in more detail below.

Light is generated by stimulated emission in the stimulated emission zone 37 of the quantum well region 19. The lateral extent of the stimulated emission zone is defined by the lateral extent of the core zone 29 of the upper mirror layer 17, and is indicated by the lines 39.

The active layer 13 of the first embodiment 11 of the VCSEL according to the invention is formed to include the diffusion enhancing region 41. In the preferred embodiment, the diffusion enhancing region is a delta-doped region located in the active layer outside the quantum well region 19. The diffusion enhancing region is preferably located within a few hundred Angstroms of the quantum well region in the upper cladding region 32 between the upper mirror layer 17 and the quantum well region.

The diffusion enhancing region 41 is doped with a high concentration of an acceptor impurity. The actual doping level of the diffusion enhancing region depends on the hole density to be induced in the quantum well region and the thickness ratio between the quantum well region and the diffusion enhancing region. When the active layer is a layer of a group III–V semiconductor, the preferred doping material for the diffusion enhancing region is carbon. Other elements that act as acceptor impurities in a group III–V semiconductor can also be used. In particular, group II elements such as magnesium, beryllium or zinc may be used to dope the diffusion enhancing region.

As noted above, in the preferred embodiment, the diffusion enhancing region 41 is a delta-doped region located in the upper cladding region 32 of the active layer 13 within a few hundred Angstroms of the quantum well region 19. Such a delta-doped region is formed by introducing a sufficient quantity of an acceptor impurity into a single atomic layer of the upper cladding region to provide a sheet doping density that is sufficiently high to induce the required hole density in the quantum well region. Suitable sheet doping densities are of the order of $10^{13}$ cm$^{-2}$, which corresponds to the impurity atoms being introduced in such a concentration that they constitute between about 0.1% and about 1% of the atoms in the single atomic layer. The way in which the required sheet density is determined is described in detail below.

The acceptors in the diffusion enhancing region 41 induce corresponding holes in the quantum well region 19. The doping level of acceptors in the diffusion enhancing region is so high that the density of holes that are induced in the quantum well region is about one order of magnitude greater than the density of electrons therein. Such a high density of holes decouples the diffusion of electrons in the quantum well, region from the diffusion of holes. The ambipolar diffusion rate, which measures the effective diffusion rate of both electrons and holes, is increased from a value similar to the hole diffusion rate to a value approaching the electron diffusion rate. The electron diffusion rate is between ten and fifty times the hole diffusion rate in typical semiconductor materials.

Increasing the ambipolar diffusion rate of the carriers in the quantum well region has two beneficial effects. First, jitter spread is reduced. The increased ambipolar diffusion rate reduces the ability of carriers to accumulate in a zone of the active layer surrounding the stimulated emission zone 37. Carriers that would otherwise accumulate in such a zone are able to diffuse laterally into the stimulated emission zone. Second, the single light beam intensity that can be generated before the onset of spatial hole burning is increased because the increased ambipolar diffusion rate enables carriers to diffuse laterally to replenish the supply of carriers in the depletion zone in the center of the stimulated emission zone 37. This prevents the carrier density in the depletion zone from falling below the threshold level, and maintains light generation throughout the stimulated emission zone.

The preferred embodiment 11 of the VCSEL according to the invention will now be described in greater detail. The lower mirror layer 15 and the upper mirror layer 17 are each preferably distributed Bragg reflectors composed of multiple pairs of mirror elements. For example, the lower mirror layer may be composed of 32.5 pairs of mirror elements and the upper mirror layer may be composed of 20 pairs of mirror elements. To simplify the drawing, only the pair of mirror elements 21 in the lower mirror layer immediately adjacent the active layer 13 is shown. Each pair of mirror elements is composed of a high refractive index mirror element and a low refractive index mirror element. The pair of mirror elements 21 is composed of the mirror elements 23 and 25, for example. In each pair of mirror elements, the two mirror elements are layers of different semiconductor materials having different refractive indices. For example, the high refractive index mirror element can be a layer of AlGaAs and the low refractive index mirror element can be a layer of AlAs. Alternatively, layers of AlAs and GaAs, or layers of other pairs of suitable materials known in the art could be used. The mirror elements are preferably constructed to reduce electrical resistance and band offset across the interfaces between adjacent mirror elements, as is known in the art. For example, a graded transition can be made between the materials of the adjacent mirror elements, or a graded short period super lattice can be formed between adjacent mirror elements. Each mirror element has a thickness of $\lambda_n/4$, where $\lambda_n$ is the wavelength in the semiconductor material of the mirror element of the light generated in the quantum well region 19.

The proton implanted zone 27 extends into the upper mirror layer 17 from the surface (not shown) of the upper mirror layer remote from the active layer 13, but does not extend into the upper mirror layer as far as the active layer. The electrical conductivity of the proton implanted zone is less than that of the core zone 29 that it surrounds. This conductivity difference confines the laser current flowing through the upper mirror layer to the core zone. In the region 33 between the depth limit of the proton implanted zone and the active layer, the laser current spreads laterally from the confinement imposed by the proton implanted zone. Hence, the laser current flowing into the quantum well region 19 of the active layer is not confined to the stimulated emission zone 37 of the quantum well region, i.e., to the part of the quantum well region that underlies the core zone of the upper mirror layer.

The active layer 13 is a layer of a semiconductor material that is transparent to the light generated in the quantum well region 19. For example, the active layer may be a layer of AlGaAs. Outside the diffusion enhancing region 41, the active layer is either undoped, or is doped with equal concentrations of donor and acceptor impurities. Alternatively, the lower cladding layer 31 of the active layer may be doped with a donor impurity at approximately the same concentration as the donor impurity in the lower mirror layer 15, and the upper cladding layer 32 may be doped with an acceptor impurity at approximately the same concentration as the acceptor impurity in the upper mirror layer 17.

The quantum well region 19 is preferably composed of between three and five quantum wells. FIG. 2C shows an example of a quantum well region having three quantum wells. The quantum well 51 is located adjacent the lower cladding region 31, and is separated from the quantum well 53 by the barrier layer 55. The quantum well 57 is located adjacent the upper cladding region 32 and is separated from the quantum well 53 by the barrier layer 59. Each quantum well is preferably a layer of gallium arsenide (GaAs) and each barrier layer is preferably a layer of AlGaAs. Each quantum well preferably has thickness of about 80 Å.

The preferred embodiment 11 of the VCSEL according to the invention is made by growing the lower mirror layer 15 on a suitable substrate (not shown) by such techniques as molecular beam epitaxy (MBE) or metal-organic chemical vapor deposition (MOCVD). These techniques of growing thin, ordered layers of semiconductor materials are known in the art. While growing the lower mirror layer 15, donor (n-type) impurities are mixed with the stream of semiconductor materials that are alternately deposited to form the lower mirror layer. Thus, the lower mirror layer is doped n-type.

A layer of AlGaAs, for example, is then deposited on the lower mirror layer 15 by MBE or MOCVD to form the lower cladding region 31 of the active layer 13 adjacent the lower mirror layer. No impurities are mixed with the material deposited to form the lower cladding region. Alternatively, equal concentrations of donor and acceptor impurities may be mixed with the material deposited to form the lower cladding region. As a further alternative, the lower cladding region may be doped with an n-type impurity at a concentration similar to that used in the lower mirror layer, with the concentration being reduced as the thickness-of the lower cladding region increases.

After the lower cladding region 31 has reached its required thickness, multiple alternating thin layers of semiconductor materials are deposited on the lower cladding region to form the quantum well region 19. After the quantum well region has been formed, more semiconductor material is deposited on the quantum well region to form the upper cladding region 32. No impurities are mixed with the material deposited to form the upper cladding region. Alternatively, equal concentrations of donor and acceptor impurities may be mixed with the material deposited to form the upper cladding region. As a further alternative, the upper cladding region may be doped with a p-type impurity at a concentration that progressively increases to a concentration similar to that which will be used in the upper mirror layer 17.

The diffusion enhancing region 41 is formed by interrupting the flow of semiconductor material deposited to form the upper cladding region 32 when the thickness of the upper cladding layer is less than a few hundred Angstroms, and by depositing acceptor impurity atoms on the surface of the partially-formed upper cladding region. Carbon atoms may be deposited as the acceptor impurity by evaporating carbon tetrabromide $CBr_4$ and bringing the vapor into contact with the partially-formed upper cladding region. Upon contact with the partially-formed upper cladding region, the carbon tetrabromide dissociates, and the resulting carbon atoms are deposited on the lattice of the semiconductor material of the partially-formed upper cladding region as the acceptor impurity. After the acceptor impurity atoms constituting the diffusion enhancing region have been deposited on the partially-formed upper cladding region, deposition of the semiconductor material forming the upper cladding region is resumed.

When the upper cladding region 32 is of such a thickness that the active layer 13 has the required total thickness of $\lambda_n$, the process of depositing materials to form the upper mirror layer 17 is begun. While depositing materials to form the upper mirror layer, acceptor impurities are mixed with the stream of the semiconductor materials alternately deposited to form the upper mirror layer. This dopes the semiconductor materials of the upper mirror layer p-type. The concentration of acceptor impurities introduced into the semiconductor materials deposited to form the upper mirror layer is substantially less than that in the diffusion enhancing region 41.

FIG. 2B shows the doping profile of the preferred embodiment 11 of the VCSEL according to the invention along the line 2B–2B in FIG. 2A. The y-axis scale in FIG. 2B corresponds to the vertical scale of FIG. 2A. FIG. 2B shows that the lower mirror layer 15 is doped with a moderate to high concentration of a donor impurity. At the boundary between the lower mirror layer and the active layer 13, the concentration of the acceptor impurity sharply decreases to match the concentration of donor impurity. The concentration of donor impurity remains substantially equal to the concentration of acceptor impurity throughout the active layer except in the diffusion enhancing region 41. In the diffusion enhancing region 41, the concentration of acceptor impurities sharply increases to a level about one order of magnitude higher than the concentrations of the donor impurity in the lower mirror layer and the acceptor impurity in the upper mirror layer 17. At the boundary between the active layer and the upper mirror layer, the concentration of acceptor impurity increases sharply to a level that approximately matches that of the donor impurity in the lower mirror layer. The acceptor impurity concentration remains at this level throughout the upper mirror layer.

As noted above, the diffusion enhancing region 41 may be a delta-doped region located anywhere in the active layer 13. However, the diffusion enhancing region is most effective when it is located in the active layer within hundred Angstroms of the quantum well region 19. In the preferred embodiment shown in FIG. 2A, the diffusion enhancing region is a delta-doped region located in the upper cladding region 32 of the active layer 13 within a few hundred Angstroms of the the quantum well region 19.

FIGS. 2C–2F show alternative locations and configurations of the diffusion enhancing region 41. The diffusion enhancing region may be a delta-doped region located in one of the barrier layers of the quantum well region 19. FIG. 2C shows part of the active layer 13 that includes the quantum well region 19. In the quantum well region, the quantum well 51 is located adjacent the lower cladding region 31, and is separated from the quantum well 53 by the barrier layer 55. The quantum well 57 is located adjacent the upper cladding region 32 and is separated from the quantum well 53 by the barrier layer 59. In the alternative shown in FIG. 2C, the diffusion enhancing region 41 is a delta-doped region located in the quantum well 19 region outside the quantum wells 51, 53, and 59. The diffusion enhancing region is shown located in the barrier layer 59, but it could alternatively be located in the barrier layer 55.

In the preferred embodiment, the diffusion enhancing region 41 is a delta-doped region located in the active layer 13 between the quantum well region and the upper mirror layer 17. However, the diffusion enhancing region may be a delta-doped region located in the lower cladding layer 31 of the active layer 13 between the quantum well region and the lower mirror layer, as shown in FIG. 2D. Again, the diffusion enhancing region is most effective if it is located within a few hundred Angstroms of the quantum well region.

Thicker layers than the delta-doped regions described above can alternatively be used as the diffusion enhancing region 41. FIG. 2E shows part of the active layer 13 in which the upper cladding region 32, the active region 19 and part of the lower cladding region 31 are heavily doped with an acceptor impurity to form the diffusion enhancing region. The diffusion enhancing region is shown as extending part-way through the lower cladding region through the whole of the upper cladding region, encompassing the quantum well region. Alternatively, the diffusion enhancing region may extend from part-way through the lower cladding region to part-way through the upper cladding region, encompassing the quantum well region. As will be described in greater detail below, the sheet density of the acceptor impurity in the bulk-doped diffusion enhancing region shown in FIG. 2E can be substantially lower than that in the delta-doped diffusion enhancing regions shown in FIGS. 2A–2C.

FIG. 2F shows a variation in which only part of the upper cladding region 32 is heavily doped with an acceptor impurity to form the diffusion enhancing region 41. A high concentration of an acceptor impurity is added to the material deposited to form the upper cladding region starting when the upper cladding region is less than a few hundred Angstroms thick. The diffusion enhancing region can extend as far as the upper mirror layer 17, as shown, or can extend part-way to the upper mirror layer. As will be discussed in detail below, the reduced thickness of the diffusion enhancing region in FIG. 2F compared with that of the diffusion enhancing region in FIG. 2E requires that the impurity density in the former be greater than that in the latter to induce the same hole density in the quantum well region 19.

Figure 3A:
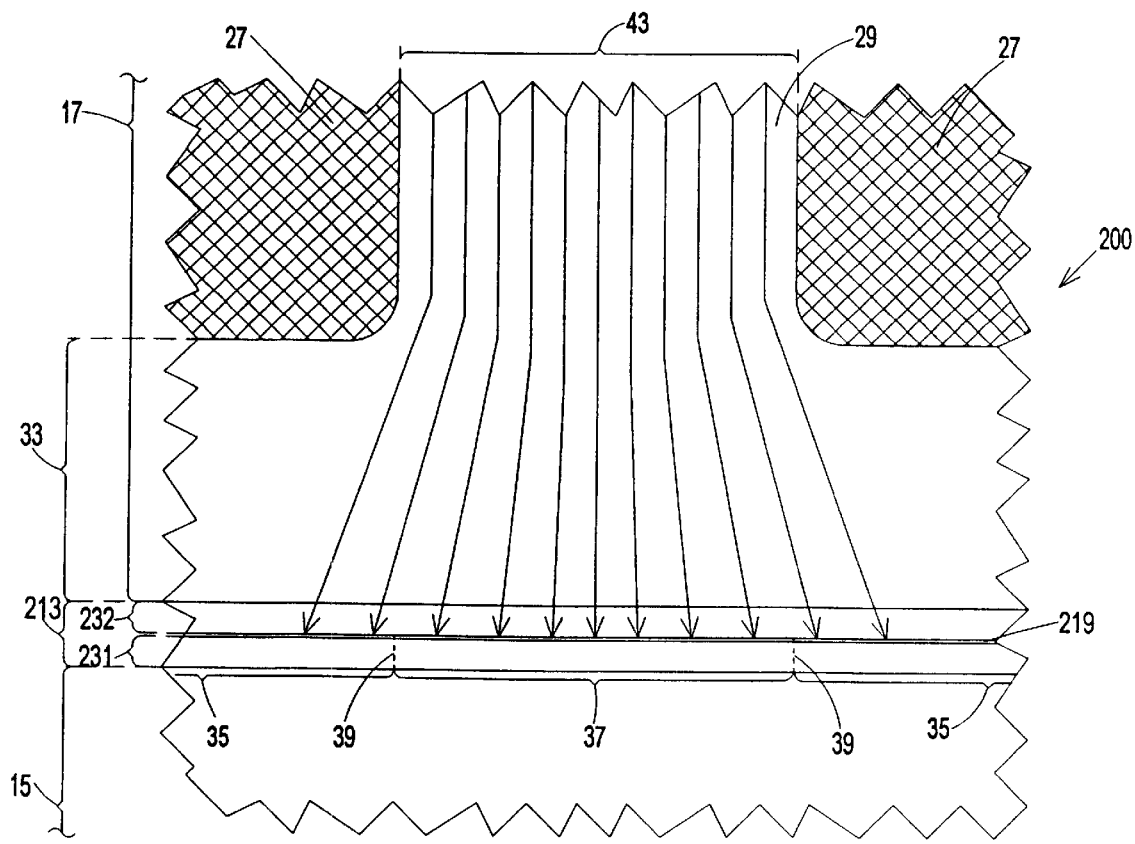
FIG. 3A is a cross sectional view of part of a known VCSEL showing the flow of laser current through the VCSEL.

The inventors' analysis of the operation of a conventional VCSEL showing the mechanism by which turn-on jitter and spatial hole burning occurs will next be described with reference to FIG. 3A. FIG. 3A shows a similar part of a conventional VCSEL 200 to the part of the preferred embodiment of the VCSEL according to the invention shown in FIG. 2A. The conventional VCSEL shown in FIG. 3A has a similar structure to the embodiment shown in FIG. 2A, except that it lacks a diffusion enhancing region in its active layer 213. Structural elements of the VCSEL shown in FIG. 3A corresponding to those of the preferred embodiment are indicated using the same reference numerals as in FIG. 2A, and will not be described in detail here. The representative pair of mirror elements 21 shown in FIG. 2A is omitted from FIG. 3A to simplify the drawing.

The laser current, indicated by the arrows 43, flows from an electrode formed on the upper surface of the upper mirror layer 17 to an electrode formed on the bottom surface of the substrate on which the lower mirror layer 15 is deposited. The electrodes, the substrate, and the upper surface of the upper mirror layer are not shown in FIG. 3A to simplify the drawing. The electrical conductivity difference between the core zone 29 and the surrounding proton implanted zone 27 of the upper mirror layer laterally confines the flow of laser current through the upper mirror layer to the core zone.

The proton implanted zone 27 also defines the lateral extent of the laser current flow 43 through the quantum well region 219 of the active layer 213, although with much less precision than in the upper mirror layer 17. Due to disruption of the crystalline structure caused by proton implantation, the proton implanted region is located in the upper mirror layer so that it does not extend as far as the active layer. The carriers spread laterally beyond the confinement imposed by the proton implanted zone in the region 33 between the depth limit of the proton implanted zone and the active layer.

Figure 3B:
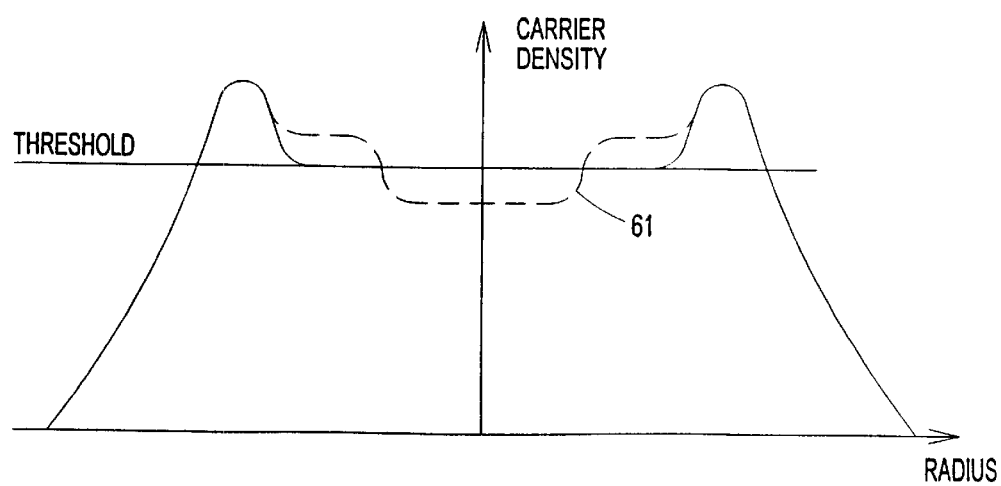
FIG. 3B is a graph showing the variation of the carrier density in the quantum well region of the known VCSEL shown in FIG. 3A.

Carriers entering the quantum well region 219 of the active layer generate light by stimulated emission. However, light generation by stimulated emission only takes place in the stimulated emission zone 37, which is the part of the quantum well region 219 that underlies the core zone 29 of the upper mirror region 17. The lateral spreading of the laser current means that some of the carriers enter the reservoir zone 35 which surrounds the stimulated emission zone and underlies the proton implanted zone 27 of the upper mirror region. Carriers that enter the reservoir zone do not generate light by stimulated emission because the reduced reflectivity of the proton implanted zone results in insufficient optical gain for stimulated emission to occur. The carriers that enter the reservoir zone are not depleted by generating light by stimulated emission. Moreover, since the conventional VCSEL 200 lacks a diffusion enhancing region in the active layer 213, the diffusion rate of the carriers in the quantum well region is relatively low, and carriers entering the reservoir zone diffuse only slowly into the stimulated emission zone. As a result, when the laser current flows, carriers accumulate in the reservoir zone. The density of the carriers that accumulate in the reservoir zone can exceed the threshold density, as shown in FIG. 3B.

The inventors' analysis of the effect of the carriers accumulated in the reservoir zone 35 on the turn-on delay of the conventional VCSEL 200 will now be described. The turn-on process of a single-mode proton-implanted VCSEL may be simulated using a set of single-mode rate equations similar to most standard carrier and photon rate equations. L. A. Coldren and S. W. Corzine describe such equations in chapter 5 of DIODE LASERS AND PHOTONIC INTEGRATED CIRCUITS, Wiley Interscience, New York (1995). However, the inventors have amended the equations to include two carrier components to take account of the effect of the carriers in the reservoir zone 35 surrounding the stimulated emission zone 37. The first component represents the carriers in the stimulated emission zone that generate light by stimulated emission when their density approaches the threshold density. The first component is described by the standard rate equations. The second component represents the carriers in the reservoir zone surrounding the stimulated emission zone. As noted above, carriers enter the reservoir zone due to lateral spreading of the laser current resulting from the imperfect lateral confinement of the laser current 43 by the proton-implanted region 27. Carriers entering the reservoir zone are unable to take part in stimulated photon emission, and, due to their low diffusion rate, diffuse out of the reservoir zone only slowly. Therefore they accumulate in the reservoir zone. The rate equations are as follows:

$$\frac{dN_1}{dt} = (1-\alpha)\eta \frac{I}{qV_1} - (R_{sp1} + R_{nr1}) - v_g g N_p - \frac{N_1 - N_2}{\tau_d}$$

$$\frac{dN_p}{dt} = \left(\Gamma v_g g - \frac{1}{\tau_p}\right) N_p + \Gamma R_{sp}$$

$$\frac{dN_2}{dt} = \alpha\eta \frac{I}{qV_2} - (R_{sp2} + R_{nr2}) + \frac{V_1}{V_2} \frac{N_1 - N_2}{\tau_d}$$

where:

$N_1$ and $N_2$ are the carrier densities in the stimulated emission zone and the reservoir zone, respectively;

$V_1$ and $V_2$ are the volumes of the stimulated emission zone and the reservoir zone, respectively;

I is the laser current;

$\alpha$ is the fraction of the laser current I entering the reservoir zone: $\alpha$ is related to $V_1$ and $V_2$ by the expression:

$$V_2 = \frac{\alpha V_1}{(1-\alpha)}$$

$N_p$ is the average photon density;

$\tau_p$ is the photon lifetime;

g is the material gain;

$v_g$ is the group velocity;

$\Gamma$ is a three-dimensional confinement factor that includes standing wave enhancements;

$\eta$ is the perpendicular injection efficiency (assumed to be equal in both the stimulated emission zone and the reservoir zone);

$R_{sp}$ is the spontaneous emission rate;

$R_{nr}$ is the nonradiative recombination rate including Auger recombination, and is the spontaneous emission rate into the lasing mode; and $\tau_d$ is the diffusion time.

The coupling term between the stimulated emission zone and the reservoir zone includes the diffusion time, $\tau_d$. This term characterizes the rate of diffusion of carriers from one zone to the other. The diffusion time can be expressed as:

$$\tau_d = \frac{L^2}{2D_{np}}$$

where:

$D_{np}$ is the ambipolar diffusion constant representing the diffusion of both electrons and holes; and L is a characteristic diffusion length between the two zones.

An exact calculation of the diffusion time would have to include the spatial dependencies of both carrier and photon densities. However, in the present analysis, a diffusion time calculated as set forth above is sufficiently precise to be used to predict the effects of carrier diffusion between the reservoir zone and the stimulated emission zone. A typical diffusion length of 5 μm and a typical ambipolar diffusion constant of 10 cm$^2$s$^{-1}$ give a typical diffusion time Cd in the order of 10 ns.

Figure 4:
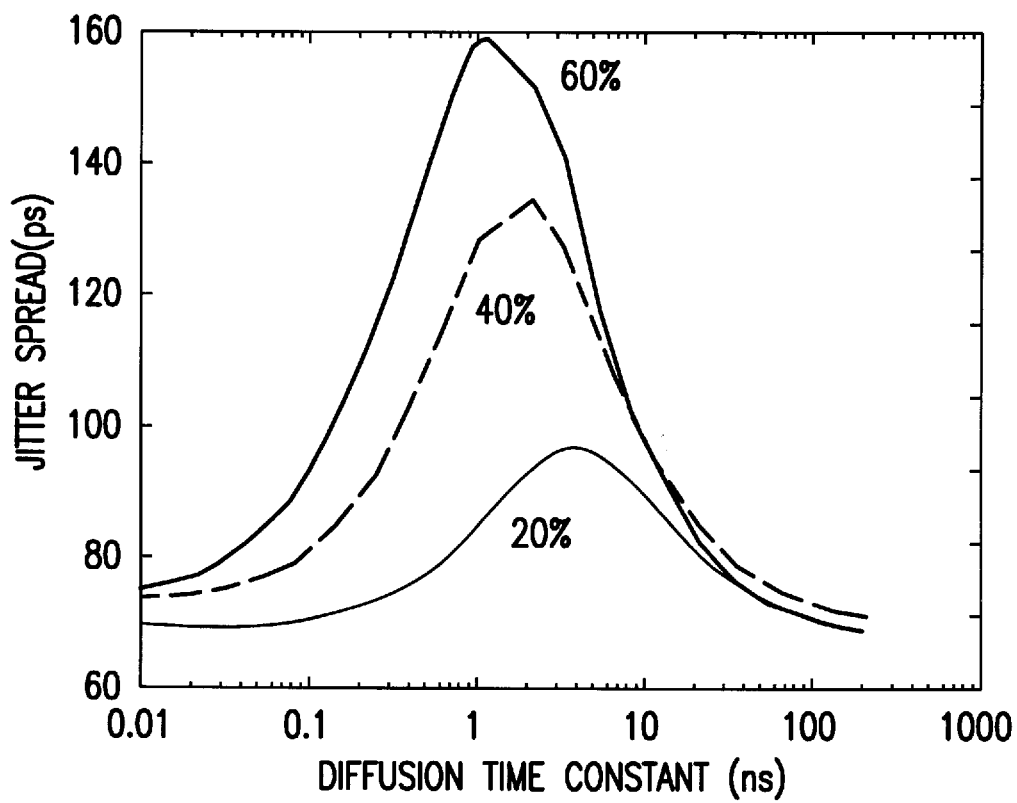
FIG. 4 is a graph showing the dependence of jitter spread on the diffusion time constant and the fraction of the laser current that enters the reservoir zone, as predicted by the inventors' model of carrier diffusion in a VCSEL.

FIG. 4 is derived from the inventors' model described above, and shows the effect of the carrier diffusion time constant on jitter spread. The jitter spread is the variation between the maximum and minimum turn-on times obtained under the conditions of curves A and B of FIG. 1A. Jitter spread occurs because carriers from the laser current accumulate in the reservoir zone 35 outside the stimulated emission zone 37. The accumulation of carriers in the reservoir zone acts as a temporary supply of carriers that diffuse into the stimulated emission zone after the laser current is switched off. The carriers diffusing into the stimulated emission zone prevent the carrier density in the stimulated emission zone from rapidly falling to zero. Instead, the diffusing carriers maintain the carrier density in the stimulated emission zone for a short time after the laser current is switched off. As a result, when the laser current is switched off briefly, as in curve B of FIG. 1A, the carrier density in the stimulated emission zone is higher than it would be if there were no carrier diffusion. This causes a shorter-than-normal turn-on time because the laser current has to inject fewer carriers into the stimulated emission zone to restore the carrier density to the threshold level.

On the other hand, when the laser current is switched off for a relatively long time, such as when a long string of 0s precedes a 1 as in FIG. 1A, sufficient time elapses for the carriers to diffuse from the reservoir zone to the stimulated emission zone, and for the density of the carriers in the stimulated emission zone then to decay to a low value. When the laser current is switched back on, the laser current must inject sufficient carriers into the stimulated emission zone to build the carrier density up from this low level to the threshold level. This requires a longer time than when the carrier density in the stimulated emission zone is maintained by the carriers diffusing from the reservoir zone. Thus, the turn-on delay varies depending on the off time of the laser current. The maximum turn-on time is obtained when the turn-on is preceded by a long off time, e.g., an off time corresponding to the time of five bits. The minimum turn-on time is obtained when the turn-on is preceded by a short off time, e.g., an off time corresponding to the time of one bit.

In FIG. 4, each curve shows how the jitter spread varies according to the diffusion time $\tau_d$ between the reservoir zone and the stimulated emission zone. Three curves are shown. Each curve is for a different percentage of the laser current entering into the reservoir zone. FIG. 4 shows that when a greater fraction of the laser current enters the reservoir zone, the jitter spread increases, and that a diffusion time in a certain range in relation to the bit rate increases the jitter spread by a factor of more than two.

FIG. 4 also shows that, when the diffusion time $\tau_d$ is very small or very large, the jitter spread reduces to a value corresponding to there being no diffusion of carriers from a reservoir of carriers. When the diffusion time is very small, carriers diffuse rapidly from the reservoir zone to the stimulated emission zone, and the carrier densities in the two zones rapidly reach equilibrium. Thus, reducing the diffusion time to a very small value can substantially reduce the jitter spread caused by carriers accumulating in the reservoir zone. On the other hand, a very large diffusion time results in carriers diffusing between the two zones so slowly that the reservoir zone cannot supply carriers to the stimulated emission zone quickly enough to maintain the carrier density in the stimulated emission zone after the laser current is turned off. Therefore, when the diffusion time $\tau_d$ is either very small or very large, diffusion of carriers from the reservoir zone does not cause a significant jitter spread. The largest jitter spread occurs when the diffusion time is comparable with the carrier lifetime.

As stated above, the diffusion time $\tau_d$ between the reservoir zone and the stimulated emission zone is related to the ambipolar diffusion constant $D_{np}$ and the characteristic diffusion length L between the reservoir zone and the stimulated emission zone by the following equation:

$$\tau_d = \frac{L^2}{2D_{np}}$$

The ambipolar diffusion constant $D_{np}$ is related to electron density N, the electron diffusion constant $D_n$, the hole density P, and the hole diffusion constant $D_p$ by the following equation:

$$D_{np} = \frac{N+P}{N/D_p + P/D_n}$$

The conventional VCSEL shown in FIG. 3A lacks a diffusion enhancing region. Consequently, the electron density in the quantum well region 219 is equal to the hole density, i.e., P=N, and the ambipolar diffusion constant is:

$$D_{np} = \frac{2D_n D_p}{D_n + D_p}$$

It can be assumed that the electron diffusion constant $D_n$ and the hole diffusion constant $D_p$ are proportional to the electron mobility $\mu_n$ and the hole mobility $\mu_p$, respectively, i.e.:

$$\frac{D_n}{D_p} = \frac{\mu_n}{\mu_p}$$

For typical quantum well region materials, the electron mobility $\mu_n$ is in the range of 10–50 times the hole mobility $\mu_p$. As a result:

$D_n >> D_p$, and $D_{np} \approx 2D_p$ in a conventional VCSEL.

Thus, in the quantum well region 219 of the conventional VCSEL, the ambipolar diffusion constant is about twice that of the hole diffusion constant, and is in the range of one-fifth to 1/25 of the electron diffusion constant.

Figure 5A:
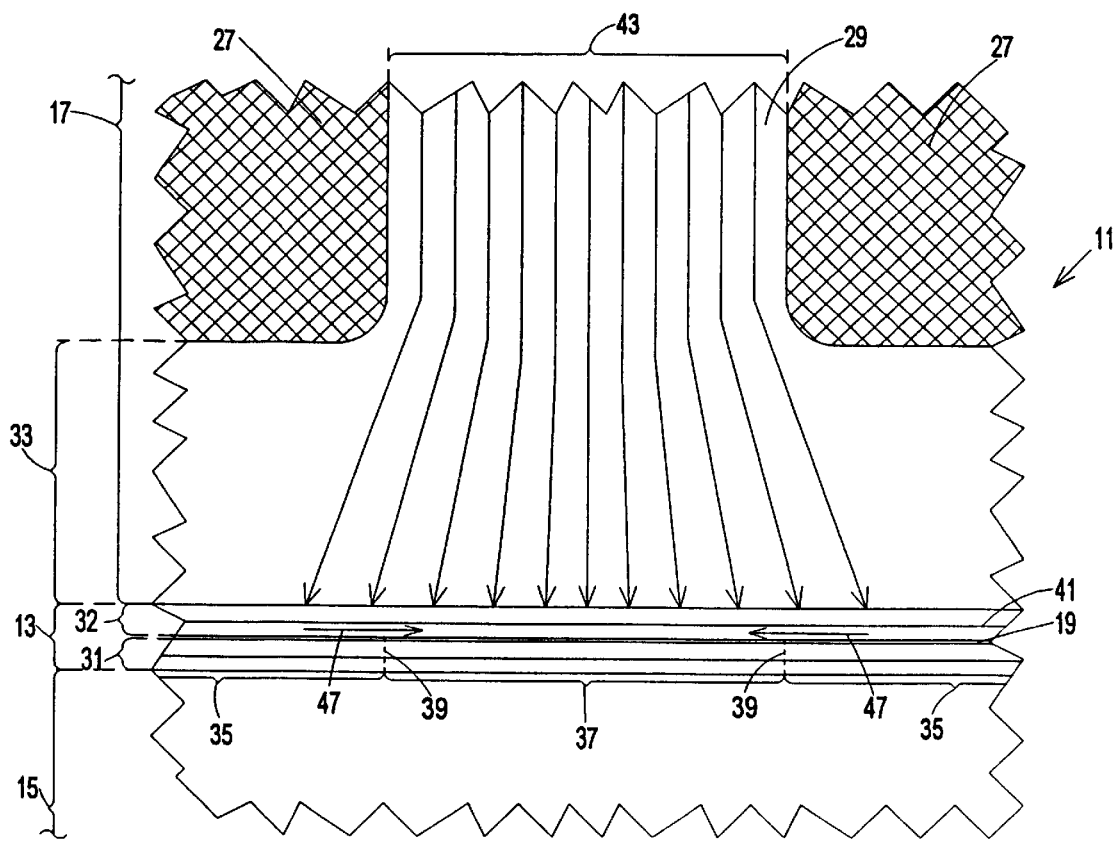
FIG. 5A is a cross sectional view of part of the preferred embodiment of the VCSEL according to the invention showing the flow of laser current through the VCSEL.
Figure 5B:
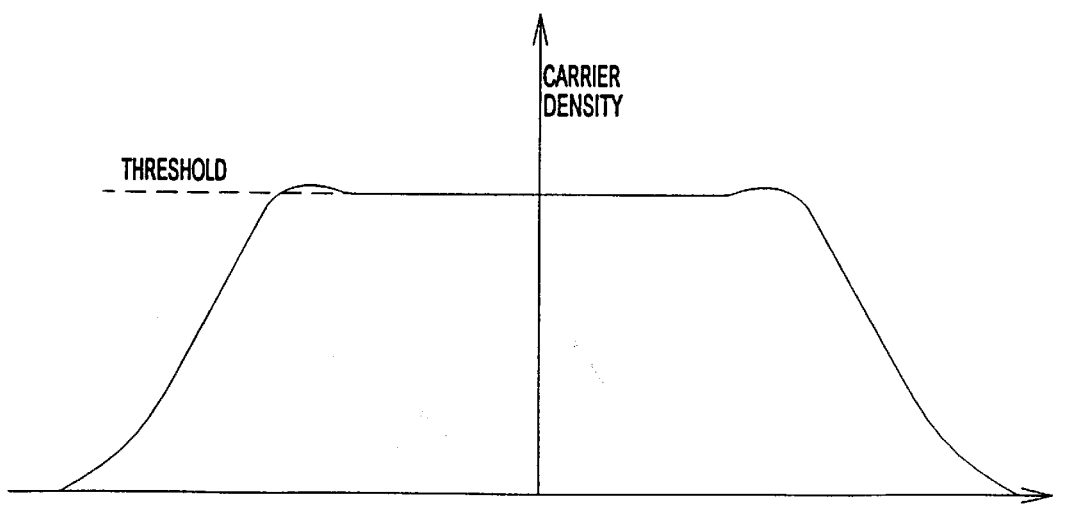
FIG. 5B is a graph showing the variation of the carrier density in the quantum well region of the preferred embodiment of the VCSEL according to the invention shown in FIG. 5A.

The action of the diffusion enhancing region in the VCSEL according to the invention in reducing jitter spread and spatial hole burning will now be described with reference to FIG. 5A and 5B using the preferred embodiment 11 of the VCSEL according to the invention as an illustrative example. FIG. 5A shows the preferred embodiment of the VCSEL according to the invention as an illustrative example. In the VCSEL 11 according to the invention, the diffusion enhancing region 41 reduces jitter spread and prevents spatial hole burning by reducing the diffusion time $\tau_d$.

The flow of the laser current through the upper mirror layer 17 of the VCSEL 11 is indicated by the arrows 43. The flow of the laser current is similar to that in the conventional VCSEL shown in FIG. 3A. The electrical conductivity difference between the core zone 29 and the surrounding proton implanted zone 27 of the upper mirror layer laterally confines the flow of laser current through the upper mirror layer to the core zone. The proton implanted zone 27 also defines the lateral extent of the laser current flow 43 through the quantum well region 19 of the active layer 13, although with much less precision than in the upper mirror layer 17. Accordingly, a fraction of the laser current enters the quantum well region in the reservoir zone 35 surrounding the stimulated emission zone 37. The carriers entering the reservoir zone are not depleted by taking part in light generation.

The VCSEL according to the invention includes the diffusion enhancing region 41 in the active layer 13. The diffusion enhancing region is heavily doped with an acceptor impurity. The high concentration of acceptor impurities in the diffusion enhancing region induces a high density of holes in the quantum well region. As a result, the density of holes in the quantum well is much greater than the density of electrons, i.e., P>>N. When the density of holes is much greater than the density of electrons, the ambipolar diffusion constant in the quantum well region becomes:

$D_{np} \approx D_n$

Thus, in the VCSEL according to the invention, the much greater density of holes in quantum well region compared with the density of electrons increases the ambipolar diffusion constant $D_{np}$ in the quantum well region to about the same as the electron diffusion constant $D_n$. In other words, the diffusion enhancing region reduces the diffusion time $\tau_d$ by a factor in the range of five to 25 compared with a conventional VCSEL. FIG. 4 shows that, in VCSELs in which the jitter spread is close to the maximum, a reduction of the diffusion time by a factor in the range of five–25 results in a significant reduction in jitter spread. This, in turn, enables the frequency at which the laser current is modulated to be increased, or enables simpler detection circuits to be used if the modulation frequency is not changed.

The reduced diffusion time $\tau_d$ caused by the diffusion enhancing region 41 enables carriers to diffuse more rapidly from the reservoir zone 35 in the quantum well region 19 to the stimulated emission zone 37 than in a conventional VCSEL. Since carriers can diffuse from the reservoir zone into the stimulated emission zone, as indicated by the arrows 47 in FIG. 5A, the density of carriers that accumulates in the reservoir zone is reduced. The resulting distribution of the carrier density is shown in FIG. 5B.

The reduced diffusion time not only reduces the maximum density of carriers that accumulate in the reservoir zone 35 while the laser current is switched on, but also reduces the time required for any carriers remaining in the reservoir zone when the laser current is switched off to diffuse into the stimulated emission zone 37 and to take part in stimulated emission. Consequently, the carrier density in the stimulated emission zone falls to a low value more rapidly after the laser current is switched off than in a conventional VCSEL. Then, when the laser current is switched back on, the laser current must always build the carrier density up from this low level. The dependence of the turn-on time on the off time is therefore reduced.

In addition to reducing the jitter spread, the increased rate of carrier diffusion caused in the quantum well region 19 by the diffusion enhancing region 41 in the VCSEL according to the invention also increases the maximum intensity of the single light beam generated by the VCSEL. As noted above, at low laser currents, stimulated emission occurs throughout the stimulated emission zone 37 with the highest intensity being generated in the center of the zone. Stimulated emission reduces the carrier density in the stimulated emission zone in proportion to the light intensity. As a result, the depletion of the carrier density is greatest in the center of the stimulated emission zone. This depletion of the carrier density in the center of the stimulated emission zone of a conventional VCSEL is indicated by the broken line 61 in FIG. 3B. As the laser current is increased, spatial hole burning occurs when the carrier density in the center of the stimulated emission zone falls sufficiently below the threshold that light is no longer generated there.

The diffusion enhancing region 41 in the active layer 13 of the VCSEL 11 according to the invention increases the rate at which carriers diffuse laterally in the active layer.

Analogously to the way in which the diffusion enhancing region speeds up the diffusion of carriers between the reservoir zone 35 and the stimulated emission zone 37 described above, the increased rate of carrier diffusion induced in the quantum well region by the diffusion enhancing region enables carriers to diffuse into the center of the stimulated emission zone when the carrier density is depleted by light generation. This prevents the carrier density in the center of the stimulated emission zone from falling so far below the threshold density that light generation no longer occurs. Accordingly, when light generation by stimulated emission depletes the carrier density in the center of the stimulated emission zone, carriers can diffuse radially inwards into the depletion zone, where they take part in generating a single light beam by stimulated emission. Since carriers from a wide area of the active layer take part in generating the single mode light beam, the maximum single mode light output of the VCSEL according to the invention is consequently greater than in a conventional VCSEL lacking a diffusion enhancing region.

Moreover, the inventors predict from their VCSEL model that, in large-area VCSELs, the effect of the diffusion enhancing region 41 on producing a more uniform distribution of carriers in the stimulated emission zone 37 will result in a more uniform distribution of modes, and that such modes will change less sporadically with increasing laser current. The more uniform distribution of modes will result in a smoother light intensity/laser current characteristic, with fewer discontinuities than in the intensity/laser current characteristics of conventional VCSELs.

The inventors also predict from their VCSEL model that the diffusion enhancing region 41 will significantly increase the differential gain of the quantum well region 19. Differential gain is the variation of gain with carrier density. The increased differential gain will increase the relaxation resonance frequency of the VCSEL according to the invention compared with a conventional VCSEL, enabling the VCSEL according to the invention to be operated at higher modulation speeds.

Finally, the process for determining the doping level in the diffusion enhancing region 41 of the VCSEL according to the invention will be described. The electron density and the hole density in the quantum well region of a conventional VCSEL are each about $4 \times 10^{18} \text{cm}^{-3}$ at the threshold level of the laser current. The product PN of the electron density and the hole density is therefore about $1.6 \times 10^{37} \text{cm}^{-6}$. In the VCSEL according to the invention, the diffusion enhancing region 41 must be heavily doped with an acceptor impurity so that the hole density P' induced in the quantum well region 19 is about one order of magnitude greater than the electron density N'. This inequality is required for the diffusion enhancing region to produce an effective increase the ambipolar diffusion constant. Also, for the VCSEL according to the invention to have approximately the same gain as a conventional VCSEL, the diffusion enhancing region has to be doped so that the product P'N' of the electron density and the hole density in the quantum well region is similar to the value of PN of the conventional VCSEL. These requirements may be satisfied, for example, by making the hole density P' in the quantum well region about ten times the electron density N', i.e.:

$$P'=10N'$$

Also:

$$P'N'=1.6 \times 10^{37}$$

Substituting for N' we get:

$$P'=1.26 \times 10^{19}$$

The corresponding electron density N' in the quantum well region is then:

$$N' = \frac{1.6 \times 10^{37}}{1.26 \times 10^{19}} = 1.26 \times 10^{18} \text{cm}^{-3}$$

This choice of values for the hole density P' and the electron density N' in the quantum well region 19 sets the hole density P' at 10 times the electron density N'. This order of inequality in the carrier densities is sufficient to increase the ambipolar diffusion constant $D_{np}$ to a value substantially equal to the electron diffusion constant $D_n$, so that the characteristic diffusion time $\tau_d$ is reduced by a factor of about half the ratio of the electron diffusion constant and the hole diffusion constant, i.e., by a factor in the range of five–25. It can be seen from FIG. 4 that reducing the diffusion time by an amount in this range produces a substantial reduction from the jitter spread.

The diffusion enhancing region 41 induces in the quantum well region 19 a sheet density $P_{QW,sheet}$ of holes substantially equal to the sheet density $P_{dope,sheet}$ of holes in the diffusion enhancing region 41. Thus, the diffusion enhancing region must be doped with an acceptor impurity at a sheet density such that the sheet density of the holes induced in the quantum well region corresponds to the desired bulk density of holes P'. The sheet density in the quantum well region $P_{QW-sheet}$ is equal to the product of the desired bulk density P' of holes in the quantum well region, and the total thickness $t_{QW}$ of the quantum wells in the quantum well region,, i.e., $$P_{QW,sheet} = P' t_{QW}$$

With the value of P' set to $1.26 \times 10^{19}$, as described above, and with three 80 Å-thick quantum wells in the quantum well region having a total thickness $t_{QW}$ of 240 Å, the sheet density $P_{QW,sheet}$ that must be induced in the quantum well region is about:

$$P_{QW,sheet} = 1.26 \times 10^{19} \times 2.4 \times 10^{-6} \approx 3 \times 10^{13} \text{cm}^{-2}$$

Delta-doped regions are characterized by their sheet doping density. Hence, in embodiments having a delta-doped diffusion enhancing region 41, such as those shown in FIGS. 2A and 2C, the diffusion enhancing region is doped such that its sheet doping density $P_{dope,sheet}$ is equal the sheet density $P_{QW,sheet}$ of the quantum well region, i.e., $$P_{dope,sheet} = P_{QW,sheet} \approx 3 \times 10^{13} \text{cm}^{-2}$$

In embodiments having a bulk doped diffusion enhancing region 41, such as those shown in FIGS. 2D and 2E, the diffusion enhancing region is also doped such that its sheet doping density $P_{dope,sheet}$ is equal the sheet density $P_{QW,sheet}$ of the quantum well region, i.e., to about $3 \times 10^{13} \text{cm}^{-2}$; i.e.:

The sheet doping density $P_{dope,sheet}$ of the diffusion enhancing region is equal to the product of the required bulk doping density $P_{dope}$ in, and the thickness $t_{DER}$ of, the diffusion enhancing region. Thus the required bulk doping density $P_{dope}$ of the diffusion enhancing region is given by:

$$P_{dope} = P' \times \frac{t_{QW}}{t_{DER}}$$

or $$P_{dope} = \frac{P_{dope,sheet}}{t_{DER}} \approx \frac{3 \times 10^{13}}{t_{DER}}$$

Thus, the bulk doping density required in the diffusion enhancing region 41 to induce a given hole density in the quantum well region is inversely proportional to the thickness of the diffusion enhancing region.

Although this disclosure describes illustrative embodiments of the invention in detail, it is to be understood that the invention is not limited to the precise embodiments described, and that various modifications may be practiced within the scope of the invention defined by the appended claims.

We claim:

1. A vertical cavity surface-emitting laser (VCSEL) having a reduced turn-on jitter and reduced spatial hole burning, the laser comprising:
   a first mirror layer of doped semiconductor material having a first conductivity mode;
   an active layer of semiconductor material adjacent the first mirror layer, the active layer including:
   a quantum well region, and
   a diffusion enhancing region in which the semiconductor material is doped with an acceptor impurity to such a high concentration that holes induced in the quantum well region predominate over electrons therein by about one order of magnitude; and
   a second mirror layer adjacent the active layer and remote from the first mirror layer, the second mirror layer being a layer of doped semiconductor material having a second conductivity mode.

2. The laser of claim 1, in which the diffusion enhancing region is located outside the quantum well region in the active layer.

3. The laser of claim 1, in which the diffusion enhancing region encompasses the quantum well region in the active layer.

4. The laser of claim 1 in which the diffusion enhancing region is a delta-doped region in the active layer.

5. The laser of claim 1, 2, 3, or 4 which the semiconductor material of the active region is a group III–V semiconductor material, and the acceptor impurity is chosen from a set consisting of group II elements and group IV elements.

6. The laser of claim 1, in which:
   the quantum well region includes quantum wells having a total thickness of $t_{QW}$; and
   in the diffusion enhancing region, the semiconductor material of the active layer is doped with the acceptor impurity at a sheet density $P_{dope,sheet}$ such that the density of holes P' induced by the diffusion enhancing region in the quantum well region exceeds $10^{19} \text{cm}^{-3}$, the sheet density $P_{dope,sheet}$ of the acceptor impurity being approximately $P' \times t_{QW}$.

7. The laser of claims in which:
   the quantum well region includes quantum wells having a total thickness of $t_{QW}$;
   the diffusion enhancing region has a thickness $t_{DER}$; and
   in the diffusion enhancing region, the semiconductor material of the active layer is doped with the acceptor impurity at a concentration $P_{dope}$ such that the density of holes P' induced by the diffusion enhancing region in the quantum well region exceeds $10^{19} \text{cm}^{-3}$, the concentration of the acceptor impurity $P_{dope}$ depending on the density of holes P' in the quantum well region, the thickness of the quantum well region and the thickness of the diffusion enhancing region according to the expression $P_{dope} = P' \times t_{QW}/t_{DER}$.

* * * * *